US008898365B2

(12) United States Patent
Masleid et al.

(10) Patent No.: US 8,898,365 B2
(45) Date of Patent: Nov. 25, 2014

(54) MICRO-LINK HIGH-BANDWIDTH CHIP-TO-CHIP BUS

(75) Inventors: Robert P. Masleid, Monte Sereno, CA (US); Sreemala Pannala, San Diego, CA (US); Michael L. Cooper, San Diego, CA (US); Bidyut K. Sen, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 441 days.

(21) Appl. No.: 13/427,508

(22) Filed: Mar. 22, 2012

(65) Prior Publication Data
US 2013/0254448 A1 Sep. 26, 2013

(51) Int. Cl.
*G06F 13/14* (2006.01)

(52) U.S. Cl.
USPC .......................................................... 710/305

(58) Field of Classification Search
CPC ................... H01L 2924/0002; H01L 2924/00; G06F 13/409
USPC .......................................................... 710/305
See application file for complete search history.

(56) References Cited

U.S. PATENT DOCUMENTS

| RE31,477 E | 12/1983 | Marshall |
| 4,818,820 A | 4/1989 | LaRock |
| 5,202,657 A | 4/1993 | Stopper |
| 5,408,053 A | 4/1995 | Young |
| 5,418,504 A | 5/1995 | Nottenburg |
| 5,548,734 A * | 8/1996 | Kolinski et al. ............... 710/305 |
| 5,553,097 A | 9/1996 | Dagher |
| 6,125,421 A * | 9/2000 | Roy .................................. 711/5 |
| 7,227,254 B2 * | 6/2007 | Devnani et al. ............... 257/691 |
| 7,362,130 B2 | 4/2008 | Broyde et al. |
| 7,817,068 B2 * | 10/2010 | Ghoneima et al. .............. 341/55 |
| 7,911,288 B1 | 3/2011 | Bokhari |
| 8,219,738 B2 | 7/2012 | Tat-Hin |

OTHER PUBLICATIONS

"Serial-Link Bus: A Low-Power On-Chip Bus Architecture"—13 pages, Dated Sep. 2009.*
Saxby, Dennis A. "High Speed Head Interconnect Design", TMRC200paper, 2000 2Rite Corporation Felton CA.
Wei, Cao, "Multiconductor Transmission Lines in Multilayered Dielectric Media" 1984 IEEE 018-9480/84/0400-0439.
Mejdoub, Youssef et al. "Transient Analysis of Lossy Multiconductor Transmission Lines Model Based by the Characteristics Method", International Journal of Engineering and Technology vol. 3, 2011, pp. 47-53.

* cited by examiner

*Primary Examiner* — Brian Misiura
(74) *Attorney, Agent, or Firm* — Park, Vaughan, Fleming & Dowler LLP; Steven E. Stupp

(57) ABSTRACT

A chip package includes a micro-link between components disposed on a substrate. The micro-link may be an ultra-short multi-conductor transmission line with shared reference planes that results in a distribution of impedance values. Furthermore, the composite signal traces in the transmission line each can support communication of one symbol at a time by ensuring that multiple reflections reach a substantial fraction of a steady-state value within a symbol time. In this way, the micro-link may facilitate continued scaling of the communication bandwidth between the components with low latency to increase the performance of computer systems that include the chip package.

20 Claims, 4 Drawing Sheets

MICRO-LINK HIGH-BANDWIDTH CHIP-TO-CHIP BUS

BACKGROUND

1. Field

The present disclosure generally relates to the design of a chip package. More specifically, the present disclosure relates to the design of a chip package that includes a high-signal-density bus that results in a distribution of impedance values and in which reflections reach a substantial fraction of a steady-state value within a symbol time.

2. Related Art

In order to achieve high performance in computer systems, the inter-chip communication channels on chip packages need to provide high-bandwidth and low-latency communication between computer system components. However, the technology used in existing inter-chip communication channels is beginning to approach its limits. For example, many existing inter-chip communication channels include signal lines that are paired with corresponding reference-to-ground or return paths. Hence, as the number of signal lines increases, the number of return paths also increases. Unfortunately, there are limits on the number of such interconnections within a chip package. Consequently, as the number of signal lines and corresponding return paths increases, the required number of inter-chip communication channels is beginning to approach these limits, which will constrain communication bandwidth, increase latency and, thus, decrease performance.

Hence, what is needed is a chip package that does not suffer from the above-described problems.

SUMMARY

One embodiment of the present disclosure provides a chip package that includes: a substrate, first connectors disposed on the substrate, second connectors disposed on the substrate, and a micro-link disposed on the substrate. The first connectors may couple to a first component and the second connectors may couple to a second component. Moreover, the micro-link may have a first end coupled to the first connectors and a second end coupled to the second connectors. Furthermore, the micro-link may include more signal lines than return paths and a length of the micro-link may be less than a pre-defined value. As a consequence, the micro-link may result in a distribution of impedance values and, when a symbol is communicated between the first component and the second component through at least one of the signal lines in the micro-link, multiple reflections reach a substantial fraction of a steady-state value within a symbol time.

Note that the first component and the second component may include integrated circuits.

Moreover, the length may be approximately less than 4 mm and/or the symbol time may be approximately less than 50 ps. Furthermore, the distribution of impedance values may include impedance values between 40-350 Ω.

In some embodiments, a ratio of a number of signal lines to a number of return paths may be at least 10 to 1.

The micro-link may facilitate 2-dimensional integration of the first component and the second component in a plane of the first component and the second component. Alternatively, the micro-link may facilitate 3-dimensional integration of the first component and the second component in a direction perpendicular to a plane of the first component and the second component.

Note that at least a subset of the signal lines may be arranged in a vertical stack with a return path in a common reference plane.

Moreover, the symbol can be communicated using the micro-link in either direction between the first connectors and the second connectors.

Additionally, the substrate may include a ceramic material and/or an organic material.

Another embodiment provides a system (such as an electronic device) that includes the chip package. This system may or may not include a processor and a memory that stores a program module.

Another embodiment provides a method for communicating a symbol between the first component and the second component using the micro-link in the chip package. During the method, the symbol is driven from the first component onto a signal line in the micro-link, where the micro-link includes more signal lines than return paths, a length of the micro-link is less than a pre-defined value, and the micro-link may result in a distribution of impedance values. Then, the symbol is received at the second component through the signal line after multiple reflections reach a substantial fraction of a steady-state value within a symbol time.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Embodiments of a chip package, a system that includes the chip package and a technique for communicating a symbol between components using a micro-link in the chip package are described. This chip package includes a micro-link between components disposed on a substrate. The micro-link may be an ultra-short multi-conductor transmission line with shared reference planes that results in a distribution of impedance values. Furthermore, the composite signal traces in the transmission line each can support communication of one symbol at a time by ensuring that multiple reflections reach a substantial fraction of a steady-state value within a symbol time.

By removing reference-to-ground or return paths in the chip package, and thereby tolerating a large asymmetry in the number of signal lines and the corresponding number of return paths (such 10 to 1 or 15 to 1), the micro-link may facilitate continued scaling of the communication bandwidth between the components with low latency. In this way, the micro-link may increase the performance of computer systems that include the chip package.

Figure 1:
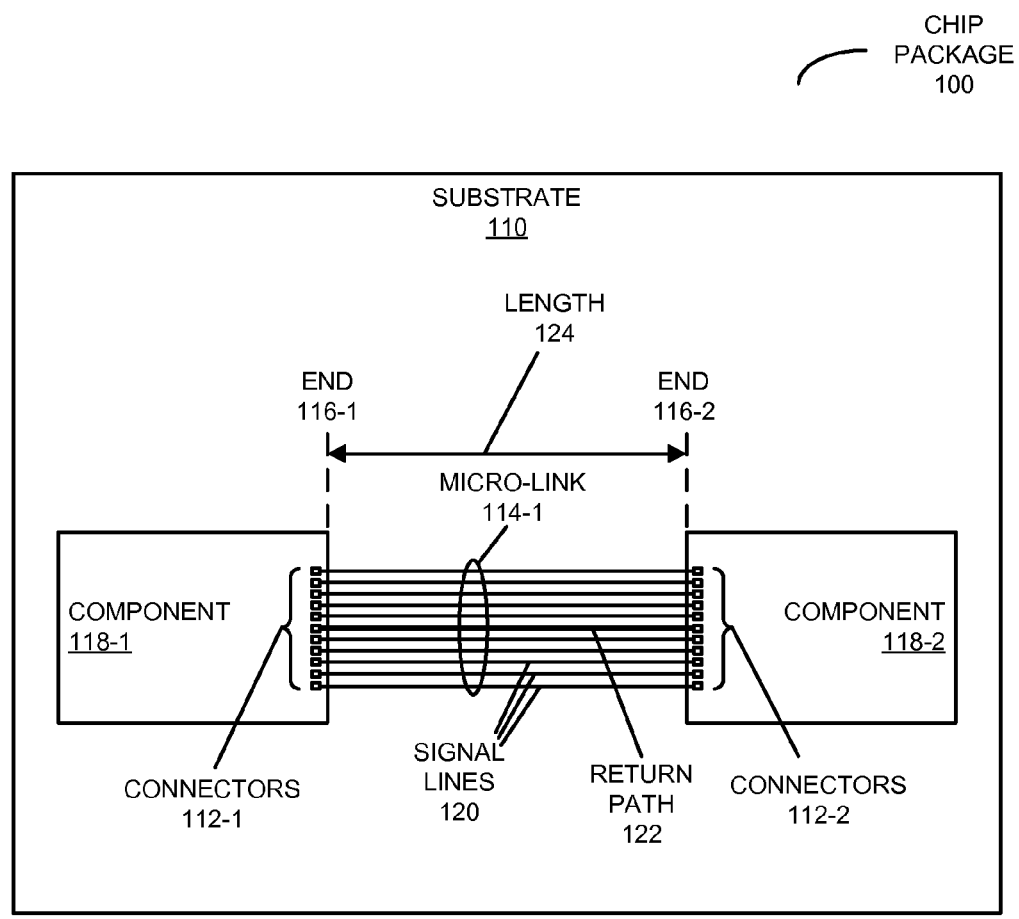
FIG. 1 is a block diagram illustrating a top view of a chip package that includes a micro-link between components in accordance with an embodiment of the present disclosure.

FIG. 1 presents a block diagram illustrating a top view of a chip package 100 that includes a micro-link 114-1 between components 118 (such as integrated circuits or chips). In particular, chip package 100 includes: substrate 110 (such as a printed circuit board and, more generally, a plastic material, a semiconductor material, a ceramic material and/or an organic material), connectors 112-1 (such as a ball-grid array, C4 solder balls, an anisotropic conducting film and/or mechanically compliant spring connectors) disposed on substrate 110, connectors 112-2 disposed on substrate 110, and micro-link 114-1 disposed on substrate 110. Connectors 112-1 may couple to component 118-1 and connectors 112-2 may couple to component 118-2. Moreover, micro-link 114-1 may have an end 116-1 coupled to connectors 112-1 and an end 116-2 coupled to connectors 112-2.

Furthermore, micro-link 114-1 may include more signal lines 120 than return paths (such as return path 122) a length 124 of micro-link 114-1 may be less than a pre-defined value (such as 2-4 mm). For example, a ratio of a number of signal lines 120 to a number of return paths may be at least 10 or 15 to 1 and/or the distribution of impedance values may include impedance values between 40-350Ω (as opposed to existing links that have a tight distribution around an average impedance of 50 or 100Ω). Note that micro-link 114-1 may include up to 500 signal lines 120. As a consequence of length 124, micro-link 114-1 may be result in a distribution of impedance values and, when a symbol is communicated between components 118 through at least one of signal lines 120 in micro-link 114-1, multiple reflections reach a substantial fraction of a steady-state value within a symbol time or a unit interval, which is the inverse of the symbol rate. (Note that the unit interval is the minimum time interval between condition changes of a data transmission signal, which is sometimes referred to as a 'pulse time,' a 'symbol time' or a 'symbol duration time.' A unit interval is the time taken in a data stream by each subsequent pulse or symbol.) For example, the symbol time may be approximately less than 50 ps. Note that the symbol can be communicated using micro-link 114-1 in either direction between connectors 112 (i.e., micro-link may facilitate unidirectional or bidirectional communication between components 118).

Thus, micro-link 114-1 may include an ultra-short multi-conductor transmission line with shared reference planes, where the composite signal or stripline traces in the transmission line each can support communication of one symbol at a time, thereby maximizing the bandwidth between components 118 and facilitating the performance increases in computer systems associated with continued bandwidth scaling.

Note that micro-link 114-1 may facilitate 2-dimensional integration of components 118 in a plane of components 118. Alternatively, micro-link 114-1 may facilitate 3-dimensional integration of components 118 in a direction perpendicular to a plane of components 118 (for example, by using through-substrate vias or TSVs).

Figure 2A:
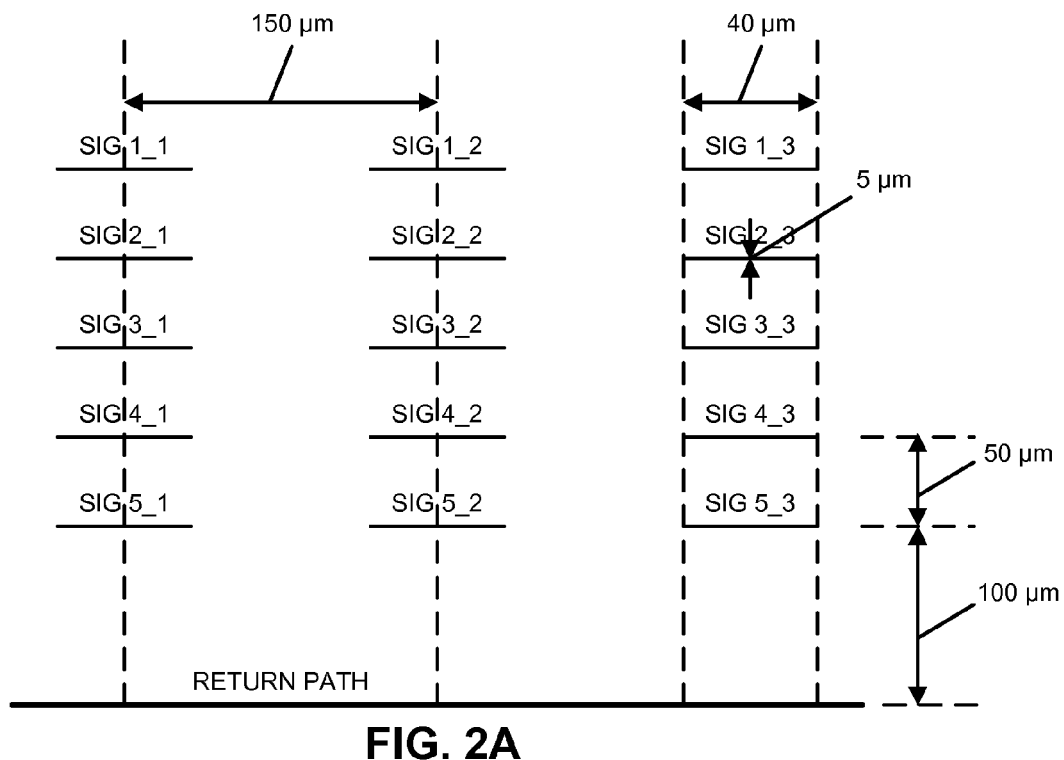
FIG. 2A is a block diagram illustrating a side view of a cross section of the micro-link in the chip package of FIG. 1 in accordance with an embodiment of the present disclosure.
Figure 2B:
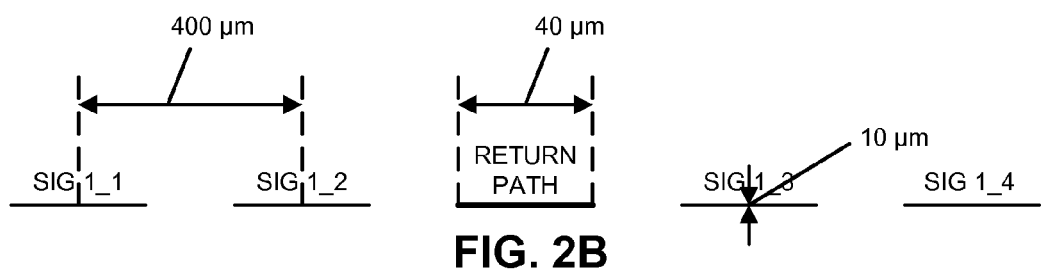
FIG. 2B is a block diagram illustrating a side view of a cross section of the micro-link in the chip package of FIG. 1 in accordance with an embodiment of the present disclosure.

In some embodiments, at least a subset of signal lines 120 is arranged in a vertical stack with a return path in a common reference plane. This is shown in FIG. 2A, which presents a block diagram illustrating a side view of a cross section of micro-link 114-1 in chip package 100 (FIG. 1). Alternatively, as shown in FIG. 2B, which presents a block diagram illustrating a side view of a cross section of micro-link 114-1 in chip package 100 (FIG. 1), at least a subset of signal lines 120 is arranged horizontally.

Referring back to FIG. 1, in an exemplary embodiment micro-link 114-1 uses an ultra-short multi-conductor transmission line to link two chips and consists of more than two single-ended signal conductors (and perhaps dozens) to maximize the bandwidth of the bus. In order to increase signal density, multiple signals routed on multiple layers within micro-link 114-1 share a reference path, which may consist of single or multiple reference planes, or sprinkled VSS traces that support micro-link 114-1. Note that the return traces may also be power supply traces. Moreover, the specific configuration may be optimized on an application-specific basis to yield noise and impedance variation reductions.

To overcome the signal integrity degradation inherent in using a shared reference plane for multiple unshielded single-ended signals, micro-link 114-1 may have a short channel length 124 that can support multiple reflections, accelerating the steady-state transition time of a signal. Furthermore, to reduce the impact of each subsequent reflection, the multi-conductor transmission line termination may be optimized using the composite modal impedances. Because routing of the multi-conductor transmission line may be predominantly through a homogeneous medium, the dephasing of the N supermodes formed by the N signals (which depend on the unit length of the transmission line) may be minimized, thereby reducing the far-end crosstalk, and which also allows the time delay to be relatively insensitive to the switching pattern.

Micro-link 114-1 may include short-route lengths (such as length 124) that can be operated at bit rates in the range of 20 Gbps. For example, based on an eye diagram using a full-wave simulation, one reflection can be tolerated at 20 Gbps. However, with length 124 of 2.3 mm, up to three reflections may be sustained at data rates up to 9 Gbps.

Moreover, micro-link 114-1 may support one symbol in a given signal line at a time in order to minimize intersymbol interference (ISI), and to limit self-symbol interference (SSI) to the weak mutual inductance from several neighboring signal lines. This may allow the symbols to be transmitted and received using CMOS inverters. For example, the input switch point of an inverter may be Vdd/2±50 mV even for extreme beta ratio changes (because of corner variation or design). In this case, a steady-state value less than 20% and greater than 80% of Vdd (after any reflections) may be, respectively, detected as a '0' or '1' with a reasonable circuit delay.

Furthermore, micro-link 114-1 may benefit from increased signal density and, thus, increased bandwidth. Note that micro-link 114-1 may be operated without pre-emphasis or encoding, and without post-decoding or decision feedback equalization. Therefore, micro-link 114-1 may be free of the inherent latency, power, and area tradeoffs that are typically associated with these operations. In an exemplary embodiment, the number of signals per reference plane in micro-link 114-1 may be increased until the inverter receiver can just barely safely detect symbols. This approach may maximize the total bandwidth of micro-link 114-1 and provide very low latency.

In addition to these benefits, micro-link 114-1 may be reversible. For example, the transmitters and receivers may have low capacitance relative to the bump and trace so that both a transmitter and a receiver can be included at each end of each signal line. This configuration may make communication via micro-link 114-1 directionally reversible (for directionally asymmetric bandwidth applications) and fully testable at wafer (by means of a wrap test in which a receiver on each pin listens to the transmitter on that pin). Furthermore, the reversibility may allow a single chip in chip package 100 to solve board layout, routing, and/or mirror-placement problems using endian-flips of its input/output (I/O) buses (such as micro-link 114-1).

In some embodiments, micro-link 114-1 is used in various geometric configurations, such as: side-by-side multi-chip modules that are connected or coupled via substrate wiring in chip package 100; side-by-side multi-chip modules that are connected or coupled via wire-bond jumpers in chip package 100; and/or stacked chips that are connected or coupled using TSVs. Note that this last embodiment may be suited to chips with multiple types of I/O implementations, such as: a serializer/deserializer (SerDes), low-voltage differential signaling (LVDS), double data rate (e.g., DDR or DDR2), a peripheral component interconnect (PCI), debug, etc. Moreover, because micro-link 114-1 can tolerate a variety of technologies for substrate 110 (e.g., ceramic, organic, etc.), a designer may be able to neglect micro-link signal requirements and can optimize substrate 110 to satisfy the demands of other I/O implementations.

In an exemplary embodiment, for large separations between signal lines 120 (such as stripline traces), the characteristic impedance of all the modes tends to that of the isolated transmission line. However, for short-separation distances between signal lines 120, the electric and magnetic fields become strongly coupled, and the impedance of the modes of the multi-conductor transmission line fans out. In general, any signal pattern sent through this multi-conductor transmission line will experience a linear combination of these discrete modes. This behavior may become more complicated when considering stacked traces with a single shared reference or ground plane (such as a vertical stack with 9 stripline traces every 50 µm and one reference plane). Furthermore, for vertically stacked traces, the modal impedance may tend to that of the modes of each composite stacked section as the vertical separation distance is varied.

In an exemplary embodiment, with a horizontal configuration of signal lines 120 (i.e., stripline traces), the trace height is 10 µm, the trace width is 40 µm, and the separation between traces is between 10-400 µm. In this example, at large separations (350 µm) the impedances associated with all of the modes may converge to 60Ω. The impedances associated with several of the modes may vary between 10 and 60Ω for separations between 0 and 350 µm. Furthermore, the impedances of the other modes may vary between 130 and 60Ω for separations between 0 and 350 µm.

Figure 3:
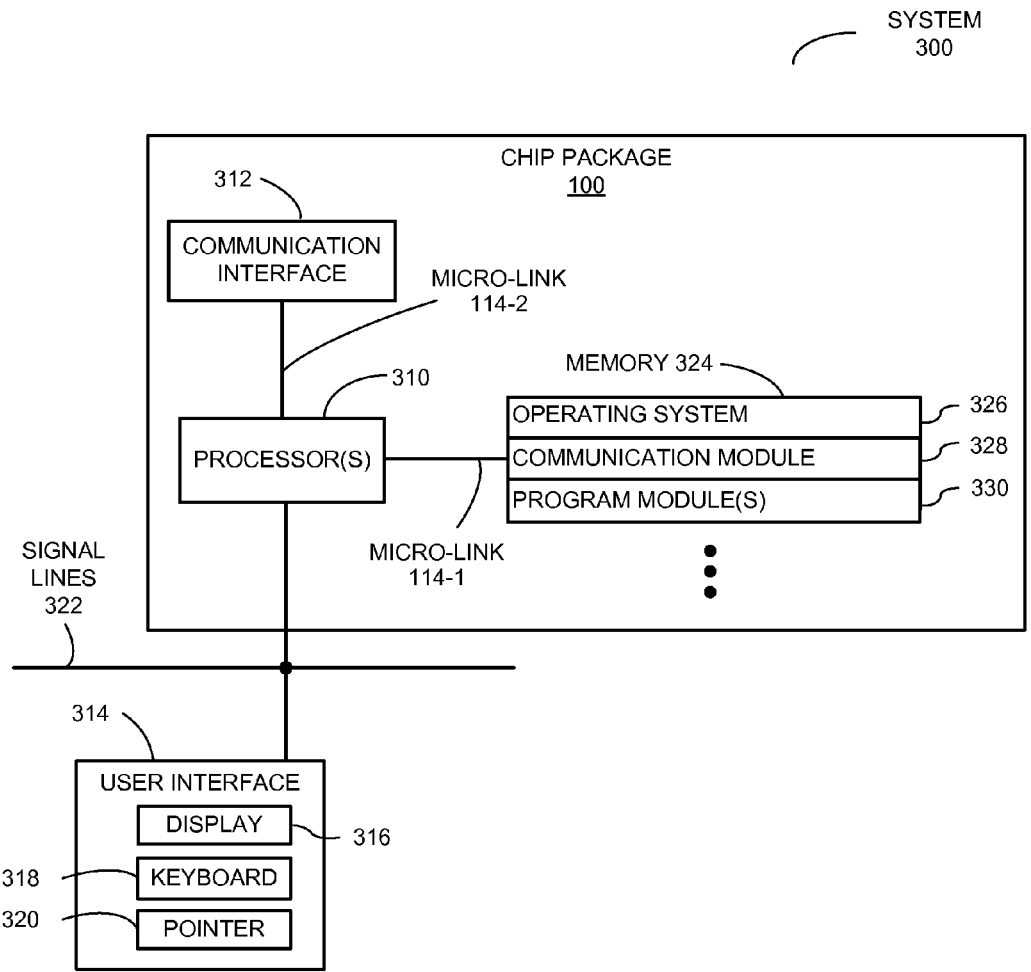
FIG. 3 is a block diagram of a system that includes a chip package in accordance with an embodiment of the present disclosure.

We now describe embodiments of the system. FIG. 3 presents a block diagram of a system 300 that includes one or more chip packages, such as chip package 100 which may couple one or more processors 310 and memory 324 using micro-link 114-1. Moreover, system 300 includes: a communication interface 312 and a user interface 314, which may be coupled to other components in system 300 by micro-links 114. Note that the one or more processors (or processor cores) 310 may support parallel processing and/or multi-threaded operation, the communication interface 312 may have a persistent communication connection, and the one or more signal lines 322 may constitute a communication bus. Moreover, the user interface 314 may include: a display 316, a keyboard 318, and/or a pointer 320, such as a mouse.

Memory 324 in system 300 may include volatile memory and/or non-volatile memory. More specifically, memory 324 may include: ROM, RAM, EPROM, EEPROM, flash, one or more smart cards, one or more magnetic disc storage devices, and/or one or more optical storage devices. Memory 324 may store an operating system 326 that includes procedures (or a set of instructions) for handling various basic system services for performing hardware-dependent tasks. Moreover, memory 324 may also store communications procedures (or a set of instructions) in a communication module 328. These communication procedures may be used for communicating with one or more computers, devices and/or servers, including computers, devices and/or servers that are remotely located with respect to the system 300.

Memory 324 may also include one or more program modules 330 (or a set of instructions). Note that one or more of program modules 330 may constitute a computer-program mechanism. Instructions in the various modules in the memory 324 may be implemented in: a high-level procedural language, an object-oriented programming language, and/or in an assembly or machine language. The programming language may be compiled or interpreted, i.e., configurable or configured, to be executed by the one or more processors (or processor cores) 310.

System 300 may include, but is not limited to: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, an electronic device, and/or another electronic computing device.

Embodiments of the chip package may be used in a variety of applications, including: VLSI circuits, communication systems (such as in wavelength division multiplexing), storage area networks, data centers, networks (such as local area networks), and/or computer systems (such as multiple-core processor computer systems). For example, the chip package may be included in a backplane that is coupled to multiple processor blades, or the chip package may couple different types of components (such as processors, memory, input/output devices, and/or peripheral devices). Thus, the chip package may perform the functions of: a switch, a hub, a bridge, and/or a router.

In general, system 300 may be at one location or may be distributed over multiple, geographically dispersed locations. Moreover, some or all of the functionality of system 300 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

The preceding embodiments may include fewer components or additional components. Moreover, although the chip package and system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that the chip package may be fabricated using an additive process (i.e., a material-deposition process) and/or a subtractive process (i.e., a material-removal process). For example, the process may include: sputtering, plating, isotropic etching, anisotropic etching, a photolithographic technique and/or a direct-write technique. Additionally, these processes may utilize a wide variety of materials, including: a semiconductor, metal, glass, sapphire, an organic material, a ceramic material, a plastic and/or silicon dioxide.

In general, during assembly components in the chip package may be positioned relative to each other, and mechanically coupled to each other, using a flip-chip process and/or a pick-and-place process. Furthermore, the mechanical coupling between the components in these embodiments may be rigid (such as that associated with glue or reflowed solder) or may be rematable to facilitate re-work of the chip package.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art, for example, AC coupling and/or DC coupling may be used.

Figure 4:
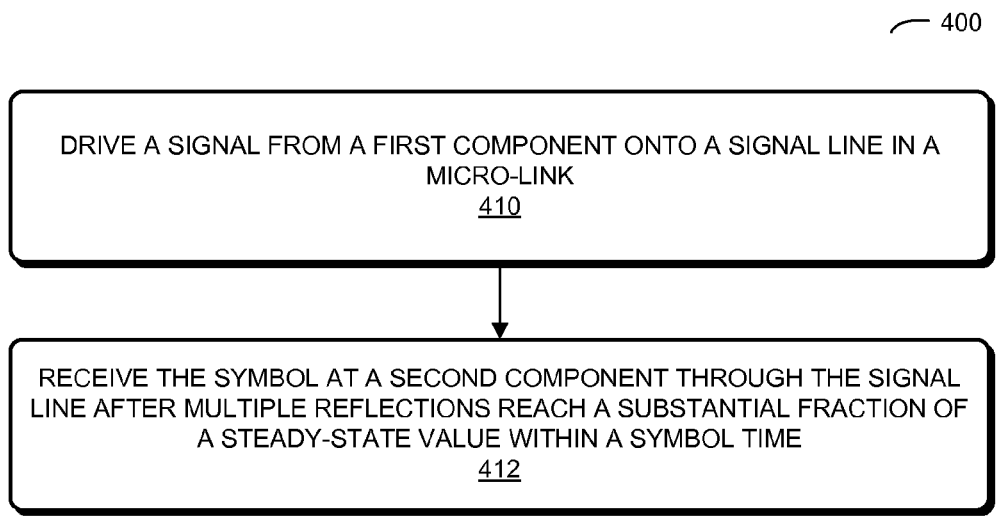
FIG. 4 is a flow chart illustrating a method for communicating a symbol between components using the micro-link in the chip package of FIG. 1 in accordance with an embodiment of the present disclosure.

We now describe embodiments of the method. FIG. 4 presents a flow chart illustrating a method 400 for communicating a symbol between components using a micro-link in a chip package, such as micro-link 114-1 in chip package 100 (FIG. 1). During the method, a symbol is driven from a first component onto a signal line in a micro-link (operation 410), where the micro-link includes more signal lines than return paths, a length of the micro-link is less than a pre-defined value, and the micro-link results in a distribution of impedance values. Then, the symbol is received at a second component through the signal line after multiple reflections reach a substantial fraction of a steady-state value within a symbol time (operation 412).

In some embodiments of method 400, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
   a substrate;
   first connectors, disposed on the substrate, configured to couple to a first component;
   second connectors, disposed on the substrate, configured to couple to a second component; and
   a micro-link, disposed on the substrate, having a first end coupled to the first connectors and a second end coupled to the second connectors,
   wherein the micro-link includes more signal lines than return paths;
   wherein a length of the micro-link is less than a pre-defined value;
   wherein the micro-link results in a distribution of impedance values, and
   wherein, when a symbol is communicated between the first component and the second component through at least one of the signal lines in the micro-link, multiple reflections reach a substantial fraction of a steady-state value within a symbol time.

2. The chip package of claim 1, wherein the first component and the second component include integrated circuits.

3. The chip package of claim 1, wherein the length is approximately less than 4 mm.

4. The chip package of claim 1, wherein the symbol time is approximately less than 50 ps.

5. The chip package of claim 1, wherein the distribution of impedance values includes impedance values between 40-350 Ω.

6. The chip package of claim 1, wherein a ratio of a number of signal lines to a number of return paths is at least 10 to 1.

7. The chip package of claim 1, wherein the micro-link facilitates 2-dimensional integration of the first component and the second component in a plane of the first component and the second component.

8. The chip package of claim 1, wherein the micro-link facilitates 3-dimensional integration of the first component and the second component in a direction perpendicular to a plane of the first component and the second component.

9. The chip package of claim 1, wherein at least a subset of the signal lines are arranged in a vertical stack with a return path in a common reference plane.

10. The chip package of claim 1, wherein the symbol can be communicated using the micro-link in either direction between the first connectors and the second connectors.

11. The chip package of claim 1, wherein the substrate includes one of a ceramic material and an organic material.

12. A system, comprising:
    a processor;
    a memory configured to store a program module, wherein the program module is configurable to be executed by the processor; and
    a chip package, wherein the chip package includes:
      a substrate;
      a first component electrically coupled to first connectors, which are disposed on the substrate;
      a second component electrically coupled to second connectors, which are disposed on the substrate; and
      a micro-link, disposed on the substrate, having a first end coupled to the first connectors and a second end coupled to the second connectors,
      wherein the micro-link includes more signal lines than return paths;
      wherein a length of the micro-link is less than a pre-defined value;
      wherein the micro-link results in by a distribution of impedance values, and
      wherein, when a symbol is communicated between the first component and the second component through at least one of the signal lines in the micro-link, multiple reflections reach a substantial fraction of a steady-state value within a symbol time.

13. The system of claim 12, wherein the first component and the second component include integrated circuits.

14. The system of claim 12, wherein the length is approximately less than 4 mm.

15. The system of claim 12, wherein the symbol time is approximately less than 50 ps.

16. The system of claim 12, wherein a ratio of a number of signal lines to a number of return paths is at least 10 to 1.

17. The system of claim 12, wherein the micro-link facilitates 3-dimensional integration of the first component and the second component in a direction perpendicular to a plane of the first component and the second component.

18. The system of claim 12, wherein at least a subset of the signal lines are arranged in a vertical stack with a return path in a common reference plane.

19. The system of claim 12, wherein the symbol can be communicated using the micro-link in either direction between the first connectors and the second connectors.

20. A method for communicating a symbol between a first component and a second component using a micro-link in a chip package, wherein the method comprises:
- driving the symbol from the first component onto a signal line in the micro-link, wherein the micro-link includes more signal lines than return paths, wherein a length of the micro-link is less than a pre-defined value, and wherein the micro-link results in a distribution of impedance values; and
- receiving the symbol at the second component through the signal line after multiple reflections reach a substantial fraction of a steady-state value within a symbol time.

* * * * *